United States Patent
Shih et al.

(10) Patent No.: US 9,437,292 B1
(45) Date of Patent: Sep. 6, 2016

(54) CIRCUITS AND METHODS FOR LIMITING CURRENT IN RANDOM ACCESS MEMORY CELLS

(71) Applicant: Taiwan Semiconductor Manufacturing Company Limited, Hsinchu (TW)

(72) Inventors: Yi-Chun Shih, Taipei (TW); Chung-Cheng Chou, Hsinchu (TW); Po-Hao Lee, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 26 days.

(21) Appl. No.: 14/621,488

(22) Filed: Feb. 13, 2015

(51) Int. Cl.
*G11C 11/00* (2006.01)
*G11C 13/00* (2006.01)

(52) U.S. Cl.
CPC ....... *G11C 13/0038* (2013.01); *G11C 13/0069* (2013.01)

(58) Field of Classification Search
CPC .................. G11C 13/0038; G11C 13/0069
USPC .................. 365/148, 189.16, 189.07
See application file for complete search history.

*Primary Examiner* — Viet Q Nguyen
(74) *Attorney, Agent, or Firm* — Jones Day (57) ABSTRACT

Circuits and methods for limiting cell current or throttling write operation, or both, in resistive random access memory (RRAM or ReRAM) cells are provided. An RRAM cell can include a select transistor and a programmable resistor that can change between a relatively high resistance and a relatively low resistance. The present circuits and methods can reduce or inhibit excess current from being applied to the programmable resistor, which potentially can regulate the resistance of the programmable resistor so as to reduce or inhibit decreases in the resistance of that resistor below the relatively low resistance. Such regulation potentially can improve reliability of the RRAM cell. Additionally, or alternatively, the present circuits and methods can throttle a write operation in an RRAM cell, e.g., can disable current flow through the RRAM cell based on the programmable resistor reaching a pre-defined target resistance, such as the relatively low resistance.

20 Claims, 7 Drawing Sheets

CIRCUITS AND METHODS FOR LIMITING CURRENT IN RANDOM ACCESS MEMORY CELLS

BACKGROUND

This application generally relates to random access memory.

One exemplary type of random access memory is resistive random access memory, which can be referred to as RRAM or ReRAM. RRAM cells can include a select transistor and a programmable resistor. Current can flow through the programmable resistor responsive to word line voltage $V_{WL}$ applied to the gate of the select transistor and a bit line voltage $V_{BL}$ applied to the RRAM. Responsive to the current, the programmable resistor can change between a relatively high resistance and a relatively low resistance. However, it can be undesirable for the current to exceed a certain value, which can cause the resistance of the programmable resistor to drop below the relatively low resistance. Such a condition can be referred to as "over-SET."

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present invention provide circuits and methods for limiting cell current or throttling write operation, or both, in resistive random access memory (RRAM or ReRAM) cells. For example, as noted above, RRAM cells can include a select transistor and a programmable resistor. Current can flow through the programmable resistor responsive to word line voltage $V_{WL}$ applied to the gate of the select transistor and a bit line voltage $V_{BL}$ applied to the source of the select transistor. Responsive to the current, the programmable resistor can change between a relatively high resistance and a relatively low resistance. The present circuits and methods can reduce or inhibit excess current from being applied to the programmable resistor, which potentially can regulate the resistance of the programmable resistor so as to reduce or inhibit decreases in the resistance of that resistor below the relatively low resistance. Such regulation potentially can improve reliability of the RRAM cell. Additionally, or alternatively, the present circuits and methods can throttle a write operation in an RRAM cell, e.g., can disable current flow through the RRAM cell based on the programmable resistor reaching a pre-defined target resistance, such as the relatively low resistance. In this regard, the present circuits and methods can be considered to regulate the resistance of the programmable resistor in the RRAM cell, e.g., during a write or "SET" operation, so as to reduce or inhibit occurrence of "over-SET," to reduce or inhibit over-stressing of the RRAM cell, and thus to improve reliability of the RRAM cell.

Figure 1:
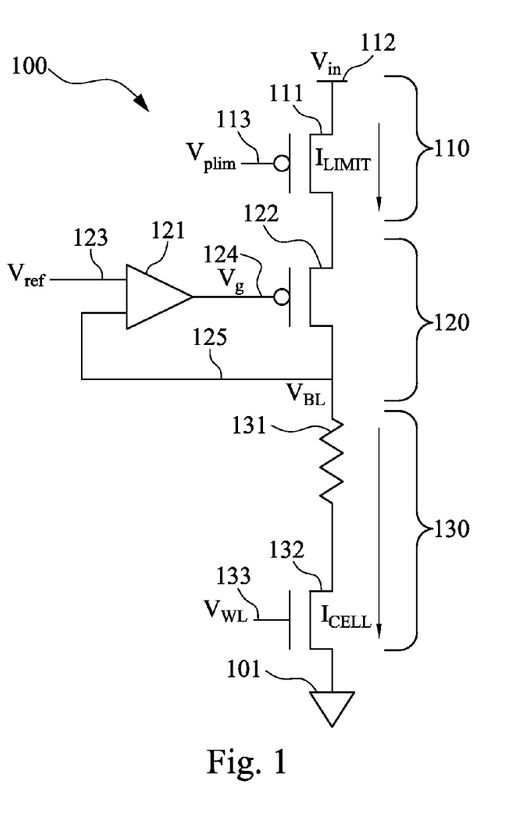
FIG. 1 illustrates a memory cell including a current limiter, in accordance with some embodiments.

FIG. 1 illustrates a memory cell 100 including a current limiter, in accordance with some embodiments. Memory cell 100 includes current limiter 110, low dropout regulator (LDO) 120, and resistive random access memory (RRAM or ReRAM) cell 130. In the embodiment illustrated in FIG. 1, LDO 120 is coupled between current limiter 110 and RRAM cell 130. Note that current limiter 110 can be considered to be a part of LDO 120, or alternatively can be considered to be a separate component from LDO 120.

As illustrated in FIG. 1, LDO 120 includes operational amplifier 121 and first PMOS transistor 122 arranged in a closed loop. A first input 123 of operational amplifier 121 receives a reference voltage $V_{REF}$ from I/O circuitry (not expressly illustrated). An output 124 of operational amplifier 121 is coupled to a gate of first PMOS transistor 122. A drain of first PMOS transistor 122 is coupled to a second input 125 of operational amplifier 121 to form the closed loop. Additionally, in the illustrated embodiment, the source of first PMOS transistor 122 is coupled to current limiter 110, and the drain of first PMOS transistor 122 is coupled to RRAM cell 130. Operational amplifier outputs gate voltage $V_g$ to the gate of first PMOS transistor 122 based upon a value of reference voltage $V_{REF}$, causing LDO 120 to output bit line voltage $V_{BL}$, e.g., to RRAM cell 130.

As illustrated in FIG. 1, RRAM cell 130 is coupled to LDO 120, e.g., below a junction between the drain of first PMOS transistor 122 and second input 125 of operational amplifier 121. RRAM cell 130 includes select transistor 132 and programmable resistor 131. A gate of select transistor 132 is coupled to a word line 133 and receives a word line voltage $V_{WL}$ from the I/O circuitry. A drain of select transistor 132 is coupled, directly or indirectly, to ground 101. In one exemplary embodiment, select transistor 132 includes an NMOS transistor. RRAM cell 130 receives as input the bit line voltage $V_{BL}$ from LDO 120. Programmable resistor 131 is configured to change between a relatively high resistance and a relatively low resistance responsive to changes in cell current $I_{CELL}$ through RRAM cell 130 based upon values of $V_{BL}$ and $V_{WL}$. In the embodiment illustrated in FIG. 1, programmable resistor 131 is coupled between first PMOS transistor 122 and select transistor 132. Alternatively, RRAM cell 130 can have a "reverse" configuration (not specifically illustrated) in which select transistor 132 is coupled between programmable resistor 131 and first PMOS transistor 122. In such alternative embodiment, note that the drain of select transistor 132 is connected to ground through programmable resistor 131.

Still referring to FIG. 1, current limiter 110 includes second PMOS transistor 111. A source of second PMOS transistor 111 is coupled to input 112 to which the I/O circuitry applies an input voltage $V_{IN}$. A gate of second PMOS transistor 111 is coupled to input 113 to which the I/O circuitry applies a limit voltage $V_{plim}$. A drain of second PMOS transistor 111 is coupled to LDO 120, e.g., is coupled to the source of first PMOS transistor 122. Current limiter 110 can be configured so as to limit a current provided to the source of first PMOS transistor 122 to a value $I_{LIMIT}$. Accordingly, the current provided to RRAM cell 130 through LDO 120 also can be limited to the value $I_{LIMIT}$, thus reducing or inhibiting application of excess current to programmable resistor 131. Additionally, based upon the current $I_{CELL}$ through RRAM cell 130 being less than $I_{LIMIT}$ and programmable resistor 131 having the relatively high resistance, a voltage across programmable resistor 131 can substantially be constant, e.g., as described below with reference to FIG. 5, and also the bias condition of $V_{BL}$ and $V_{WL}$ may not necessarily be affected by current limiter 110.

Figure 4:
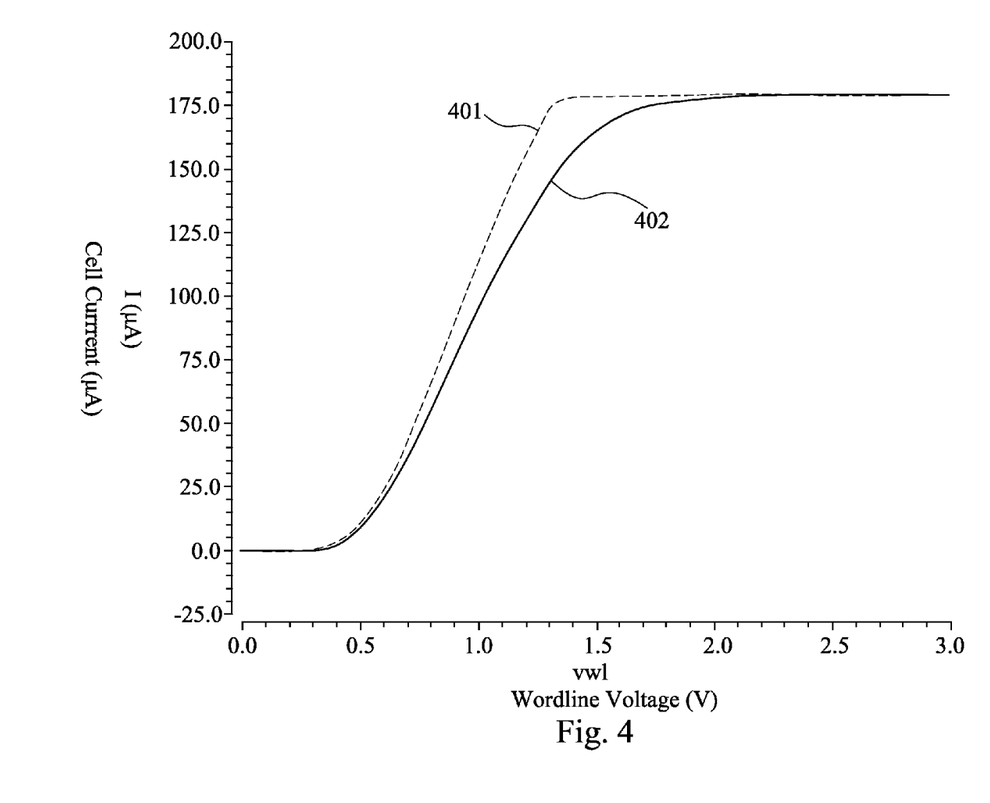
FIG. 4 illustrates an exemplary plot of respective cell current through an RRAM cell of a memory cell including a current limiter and through an RRAM cell of an alternative memory cell, as a function of word line voltage, in accordance with some embodiments.

Furthermore, based upon $I_{CELL}$ approaching or equaling $I_{LIMIT}$ responsive to programmable resistor 131 changing from the relatively high resistance to the relatively low resistance, a voltage across second PMOS transistor 111 increases. Based upon the voltage across second PMOS transistor 111 increasing, the voltage across RRAM cell 130 decreases, and $I_{CELL}$ is limited to a level that reduces or inhibits a further decrease in the resistance of programmable resistor 131. Note that current limiter 110 can be considered to be cascaded by first PMOS transistor 122 of LDO 120 so as to boost the impedance of current limiter 110, which can provide current limiter with a relatively sharper current limiting characteristic such as illustrated in FIG. 4. An exemplary circuit for controlling the value of limit voltage $V_{plim}$ so as to limit the current provided to the source of first PMOS transistor 122 to the value $I_{LIMIT}$ is described in greater detail below with reference to FIG. 6. However, it should be appreciated that other circuits for controlling the value of limit voltage $V_{plim}$ suitably can be used.

Figure 2:
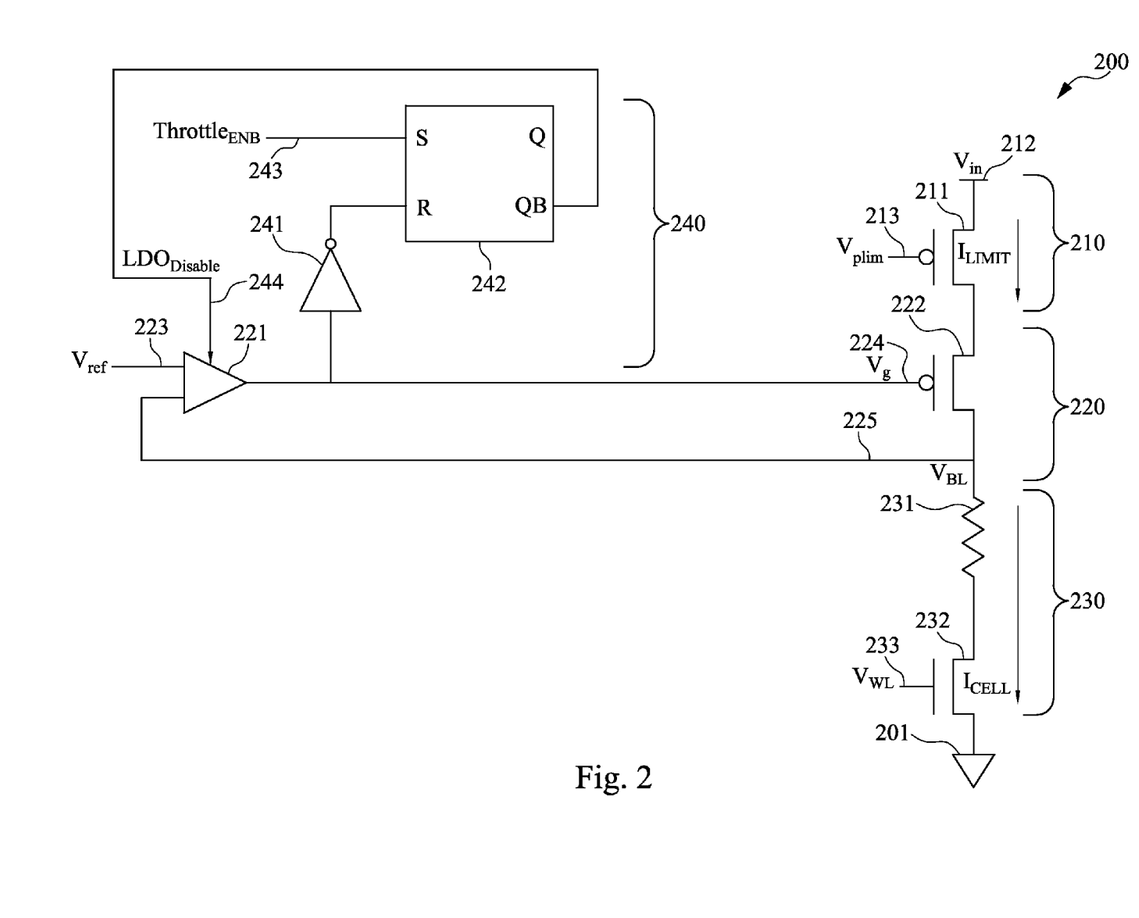
FIG. 2 illustrates a memory cell including a current limiter and a circuit for throttling write operation, in accordance with some embodiments.

In certain embodiments, a memory cell additionally or alternatively can include a circuit for throttling write operation, e.g., so as to disable the flow of current $I_{LIMIT}$ through the gate of first PMOS transistor 122 based upon the resistance of programmable resistor 131 reaching a threshold, e.g., the relatively low resistance. For example, FIG. 2 illustrates a memory cell 200 including a current limiter and circuit for throttling write operation, in accordance with some embodiments. It should be understood that memory cell 200 suitably can be modified so as to include a circuit for throttling write operation, but so as to exclude the current limiter provided herein or so as to include a different current limiter than in the embodiment specifically illustrated in FIG. 2.

In the embodiment illustrated in FIG. 2, memory cell 200 includes current limiter 210, LDO 220, and RRAM cell 230. LDO 220 is coupled between current limiter 210 and RRAM cell 230. Note that current limiter 210 can be considered to be a part of LDO 220, or alternatively can be considered to be a separate component from LDO 220.

As illustrated in FIG. 2, LDO 220 includes operational amplifier 221 and first PMOS transistor 222 that can be arranged in a closed loop in a manner analogous to that described above with reference to operational amplifier 121 and first PMOS transistor 122 of memory cell 100 illustrated in FIG. 1. For example, first input 223 of operational amplifier 221 receives a reference voltage $V_{REF}$ from I/O circuitry (not expressly illustrated). An output 224 of operational amplifier 221 is coupled to a gate of first PMOS transistor 222. A drain of first PMOS transistor 222 is coupled to a second input 125 of operational amplifier 121 to form the closed loop. Additionally, in the illustrated embodiment, the source of first PMOS transistor 222 is coupled to current limiter 210, and the drain of first PMOS transistor 222 is coupled to RRAM cell 230. Operational amplifier outputs gate voltage $V_g$ to the gate of first PMOS transistor 222 based upon a value of reference voltage $V_{REF}$, causing LDO 220 to output bit line voltage $V_{BL}$, e.g., to RRAM cell 230.

As illustrated in FIG. 2, RRAM cell 230 is coupled to LDO 220, e.g., below a junction between the drain of first PMOS transistor 222 and second input 225 of operational amplifier 221. RRAM cell 230 includes select transistor 232 and programmable resistor 231 that can be arranged in a manner analogous to that described above with reference to select. A gate of select transistor 132 is coupled to a word line 233 and receives a word line voltage $V_{WL}$ from the I/O circuitry. A drain of select transistor 232 is coupled, directly or indirectly, to ground 201. In one exemplary embodiment, select transistor 232 includes an NMOS transistor. RRAM cell 230 receives as input the bit line voltage $V_{BL}$ from LDO 220. Programmable resistor 231 is configured to change between a relatively high resistance and a relatively low resistance responsive to changes in cell current $I_{CELL}$ through RRAM cell 230 based upon values of $V_{BL}$ and $V_{WL}$. In the embodiment illustrated in FIG. 2, programmable resistor 231 is coupled between first PMOS transistor 222 and select transistor 232. Alternatively, RRAM cell 230 can have a "reverse" configuration (not specifically illustrated) in which select transistor 232 is coupled between programmable resistor 231 and first PMOS transistor 222. In such alternative embodiment, note that the drain of select transistor 232 is connected to ground through programmable resistor 231.

Still referring to FIG. 2, current limiter 210 includes second PMOS transistor 211. A source of second PMOS transistor 211 is coupled to input 212 to which the I/O circuitry applies an input voltage $V_{IN}$. A gate of second PMOS transistor 211 is coupled to input 213 to which the I/O circuitry applies a limit voltage $V_{plim}$. A drain of second PMOS transistor 211 is coupled to LDO 220, e.g., is coupled to the source of first PMOS transistor 222. Current limiter 210 can be configured so as to limit a current provided to the source of first PMOS transistor 222 to a value $I_{LIMIT}$. Accordingly, the current provided to RRAM cell 230 through LDO 220 also can be limited to the value $I_{LIMIT}$, thus reducing or inhibiting application of excess current to programmable resistor 231. Additionally, based upon the current $I_{CELL}$ through RRAM cell being less than $I_{LIMIT}$ and programmable resistor 231 having the relatively high resistance, a voltage across programmable resistor 231 is substantially constant. Furthermore, based upon $I_{CELL}$ approaching or equaling $I_{LIMIT}$ responsive to programmable resistor 231 changing from the relatively high resistance to the relatively low resistance, a voltage across second PMOS transistor 211 increases. Based upon the voltage across second PMOS transistor 211 increasing, $I_{CELL}$ is limited to a level that reduces or inhibits a further decrease in the resistance of programmable resistor 231. An exemplary circuit for controlling the value of limit voltage $V_{plim}$ so as to limit the current provided to the source of first PMOS transistor 222 to the value $I_{LIMIT}$ is described in greater detail below with reference to FIG. 6. However, it should be appreciated that other circuits for controlling the value of limit voltage $V_{plim}$ suitably can be used.

In the embodiment illustrated in FIG. 2, write throttle circuit 240 includes inverter 241 and flip-flop 242. Flip-flop 242 also can be referred to as an SR-latch. Inverter 241, e.g., a low-skewed inverter, includes an input coupled to the output 224 of operational amplifier 221 and an output coupled to a reset input R of flip-flop 242. A set input S of flip-flop 242 receives a write voltage Throttle$_{ENB}$ from the I/O circuitry. An output QB of flip-flop 242 is coupled to a third input 244 of operational amplifier 221. Inverter 241 is configured to output a transition signal to the reset input R of flip flop 242 based upon $V_g$ becoming lower than a threshold $V_{th,n}$ based upon programmable resistor 231 changing to a target resistance, e.g., the relatively low resistance. Flip-flop 242 outputs an LDO disable signal LDO$_{Disable}$ to operational amplifier 221 responsive to the transition signal from inverter 241 and based upon write voltage Throttle$_{ENB}$ being high. The output $V_g$ of operational amplifier 221 disables current flow through the gate of first PMOS transistor 222 responsive to the LDO$_{Disable}$ signal. Accordingly, at the start of a write operation, Throttle$_{ENB}$ can go from high to low so as to enable write detection, based upon which the output at Q is high and the output at QB is low, so that LDO 220 is not disabled. Inverter 241 can monitor the output $V_g$ from operational amplifier 221. The value of $V_g$ can vary based upon the resistance of programmable resistor 231. The threshold $V_{th,n}$ can be selected so as to correspond to a change in programmable resistor 231 from the relatively high resistance to the relatively low resistance, e.g., corresponding to a write operation. As such, inverter 241 can detect when the value $V_g$ becomes less than or equal to the threshold $V_{th,n}$ and can output an appropriate signal, e.g., an inverted signal, so as to reset input R of flip-flop 242 so as to trigger flip-flop 242 to generate the LDO disable signal LDO$_{Disable}$ at QB and to provide such signal to operational amplifier 221 so as to cease the write operation by disabling current flow through the gate of first PMOS transistor 222. In some embodiments, by sizing the nFET of inverter 241 so as to be significantly larger than the pFET of inverter 241, the threshold voltage of the inverter becomes relatively close to the threshold voltage of the nFET, which can be denoted as $V_{th,n}$. On the other hand, as shown in the curve 503 described in greater detail below with reference to FIG. 5, $V_g$ 224 can have a relatively sharp transition based on the amplification provided by operational amplifier 221. The threshold of $V_{th,n}$ need not be precise for the circuit to function properly.

Optionally, memory cell 200 further can include a delay circuit (not specifically illustrated) coupled between the output of flip-flop 242 and third input 244 of operational amplifier 221. The delay circuit can be configured to delay transmission of LDO$_{Disable}$ to third input 244 of operational amplifier 221 by a preselected amount of time. In one illustrative embodiment, the delay circuit includes a plurality of inverters connected in series with one another. However, other delay circuits readily may be envisioned.

It should be appreciated that a memory cell need not necessarily include both a current limiter and a write throttle circuit such as described above with reference to FIG. 2. For example, a memory cell can include a current limiter, or can include a write throttle circuit, or can include both a current limiter and a write throttle circuit. Any suitable combination of components can be used. Additionally, note that a write throttle circuit can be implemented differently than is illustrated in FIG. 2. For example, instead of using an inverter to detect the output $V_g$ of the operational amplifier, the write throttle circuit can include a current mirror and compare the mirrored current of $I_{CELL}$ (e.g., the current flowing through pFET 361 illustrated in FIG. 3) against a reference current. Other configurations can be used.

So as to facilitate understanding of exemplary functionalities of memory cell 100 illustrated in FIG. 1 and memory cell 200 illustrated in FIG. 2, an alternative memory cell 300 will be described with reference to FIG. 3. Subsequently, simulated performance of memory cells 100 and 300 will be described with reference to FIGS. 4 and 5.

Figure 3:
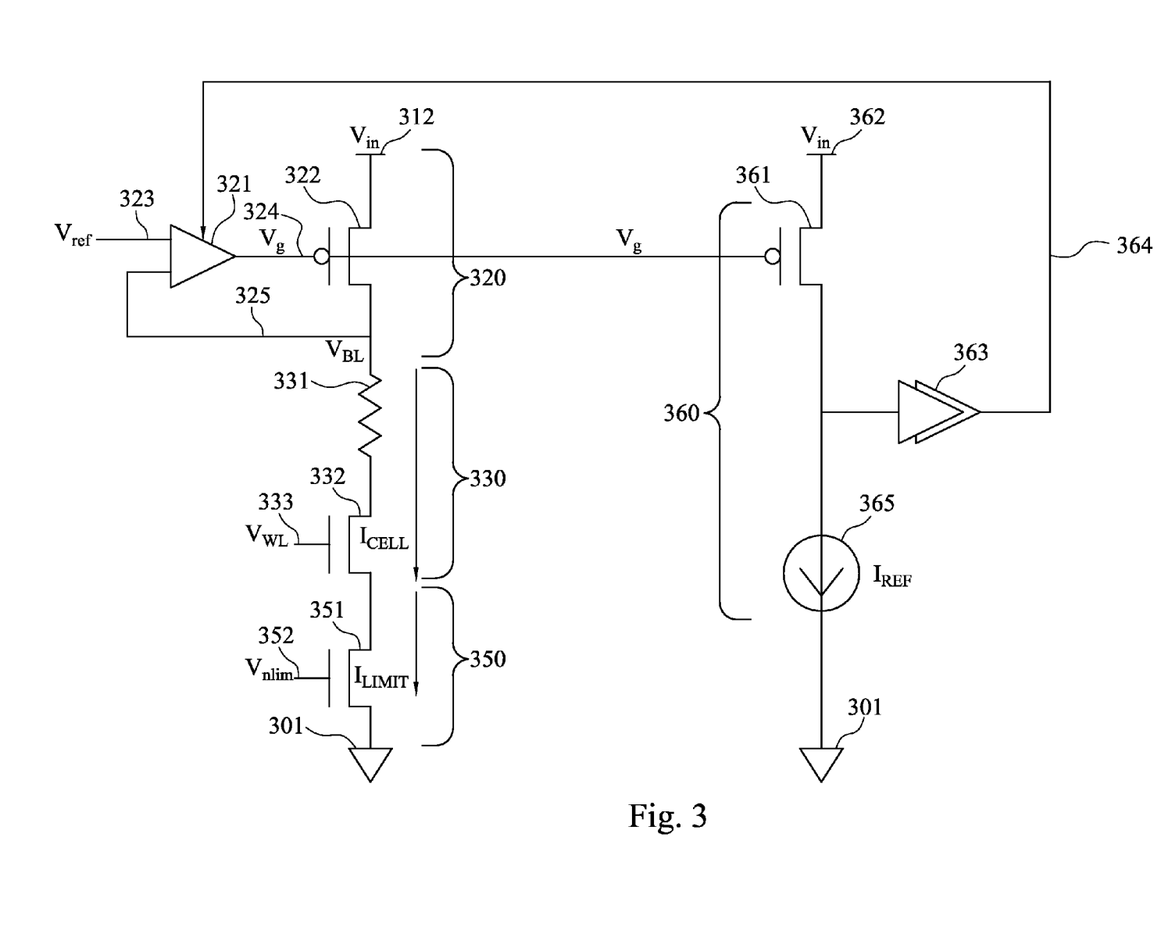
FIG. 3 illustrates an alternative memory cell, in accordance with some embodiments.

FIG. 3 illustrates an alternative memory cell 300, according to some embodiments. Alternative memory cell 300 includes alternative LDO 320, alternative RRAM cell 330, alternative current limiter 350, and alternative write throttling circuit 360. In alternative memory cell 300, alternative RRAM cell 330 is connected between alternative LDO 320 and alternative current limiter 350.

As illustrated in FIG. 3, alternative LDO 320 includes operational amplifier 321 and first PMOS transistor 322 arranged in a closed loop. A first input 323 of operational amplifier 321 receives a reference voltage $V_{REF}$ from I/O circuitry (not expressly illustrated). An output 324 of operational amplifier 321 is coupled to a gate of first PMOS transistor 322. A source of first PMOS transistor 322 is coupled to input 312 to which the I/O circuitry applies an input voltage $V_{in}$. A drain of first PMOS transistor 322 is coupled to a second input 325 of operational amplifier 321 to form the closed loop. Operational amplifier outputs gate voltage $V_g$ to the gate of first PMOS transistor 322 based upon a value of reference voltage $V_{REF}$, causing alternative LDO 320 to output bit line voltage $V_{BL}$, e.g., to alternative RRAM cell 330.

As illustrated in FIG. 3, alternative RRAM cell 330 is coupled to alternative LDO 320, e.g., below a junction between the drain of first PMOS transistor 322 and second input 325 of operational amplifier 321. Alternative RRAM cell 330 includes select transistor 332 and programmable resistor 331. A gate of select transistor 332 is coupled to a word line 333 and receives a word line voltage $V_{WL}$ from the I/O circuitry. Select transistor 332 includes a first NMOS transistor. Alternative RRAM cell 330 receives as input the bit line voltage $V_{BL}$ from alternative LDO 320. Programmable resistor 331 is configured to change between a relatively high resistance and a relatively low resistance responsive to changes in cell current $I_{CELL}$ through RRAM cell 330 based upon values of $V_{BL}$ and $V_{WL}$. In the alternative memory cell illustrated in FIG. 3, programmable resistor 331 is coupled between first PMOS transistor 322 and select transistor 332.

Still referring to FIG. 3, alternative current limiter 350 includes second NMOS transistor 351. A source of second NMOS transistor 351 is coupled to the drain of first NMOS transistor 332. A gate of second NMOS transistor 351 is coupled to input 352 to which the I/O circuitry applies a limit voltage $V_{nlim}$. A drain of second NMOS transistor 351 is coupled to ground 301. Alternative current limiter 350 can be configured so as to limit a current through second NMOS transistor 351 a value $I_{LIMIT}$, so as also to limit the current $I_{CELL}$ through RRAM cell 330 to the value $I_{LIMIT}$, with the intention of reducing application of excess current to programmable resistor 331. In the alternative embodiment illustrated in FIG. 3, the current $I_{CELL}$ through RRAM cell 330 can change based on changes in the resistance of programmable resistor 331, which can cause changes in the voltage across RRAM cell 330. In comparison, in write operation of memory cell 100 illustrated in FIG. 1 or memory cell 200 illustrated in FIG. 2, the voltage across RRAM cell 130 or RRAM cell 230 respectively can be substantially constant based on $I_{CELL}$ being less than $I_{LIMIT}$.

Furthermore, whereas a voltage across second PMOS transistor 111 or 211 respectively illustrated in FIG. 1 or FIG. 2 can increase responsive to the programmable resistor changing from the relatively high resistance to the relatively low resistance, which can cause $I_{CELL}$ to decrease to a level that reduces or inhibits a further decrease in the resistance of programmable resistor 331, in comparison, a voltage across second NMOS transistor 351 of alternative memory cell 300 can increase responsive to the programmable resistor changing from the relatively high resistance to the relatively low resistance, which can cause $I_{CELL}$ to decrease and thus potentially to suppress a further decrease in the resistance of programmable resistor 331. In some embodiments, alternative memory cell 300 can include alternative write throttling circuit 360. Alternative write throttling circuit can include second PMOS transistor 361, buffer 363, e.g., a pair of inverters, and reference current source 365. A gate of second PMOS transistor 361 can be coupled to the gate of first PMOS transistor 322 so as to receive voltage $V_g$ as output from operational amplifier 321. A source of second PMOS transistor 361 can be coupled to input 362 via which the I/O circuit can apply input voltage $V_{in}$ that can be the same as, or different than, the input voltage applied to input 361. An input of buffer 363 can be coupled to the drain of second PMOS transistor 361 and to current source 365, which can generate reference current $I_{REF}$. Buffer 363 generates an output based upon a difference between $I_{CELL}$ through alternative RRAM cell 330 and $I_{REF}$ generated by current source 365 and provides such output as a third input to operational amplifier 321. For example, based upon $I_{CELL}$ being greater than $I_{REF}$, buffer 363 can generate an $LDO_{Disable}$ signal that causes operational amplifier 321 to disable current flow through the gate of first PMOS transistor 322.

FIG. 4 illustrates an exemplary plot of respective cell current through an RRAM cell of a memory cell including a current limiter in accordance with some embodiments, e.g., through RRAM cell 130 of memory cell 100 illustrated in FIG. 1, and through an RRAM cell of a alternative memory cell, e.g., through alternative RRAM cell 330 of alternative memory cell 300 illustrated in FIG. 3, as a function of word line voltage. The plots in FIGS. 4 and 5 were prepared using Cadence Analog Design Environment (ADE) software (Cadence Design Systems, San Jose, Calif.). The plot illustrated in FIG. 4 was prepared by initially simulating a word line voltage $V_{WL}$ equal to zero, based upon which cell current $I_{CELL}$ also is zero, and then simulating changes in the cell current $I_{CELL}$ based on increases in $V_{WL}$ up to a value of 3.0V. It can be seen in FIG. 4 that the cell current $I_{CELL}$ 401 through RRAM cell 130 (illustrated in FIG. 1) increases beginning at a word line voltage $V_{WL}$ of approximately 0.5 V to a value of approximately 175.0 μA at word line voltage $V_{WL}$ of approximately 1.3 V. It also can be seen in FIG. 4 that cell current $I_{CELL}$ 402 through alternative RRAM cell 330 (illustrated in FIG. 3) increases beginning at a word line voltage $V_{WL}$ of approximately 0.5 V to a value of approximately 175.0 at word line voltage $V_{WL}$ of approximately 2.0 V. Accordingly, it can be understood from FIG. 4 that for a word line voltage of $V_{WL}$ of approximately 1.3 V, the cell current $I_{CELL}$ 401 through RRAM cell 130 is approximately 25 μA higher than the cell current $I_{CELL}$ 402 through alternative RRAM cell 330. Accordingly, it can be understood from FIG. 4 that for a given value of $I_{LIMIT}$, current limiter 110 illustrated in FIG. 1 potentially can facilitate write operations at a lower word line voltage than can alternative current limiter 350 illustrated in FIG. 3. Using a lower word line voltage potentially can improve the lifetime of the transistor 132. Additionally, as noted further above with reference to FIG. 1, current limiter 110 can be considered to be cascaded by first PMOS transistor 122 of LDO 120 so as to boost the impedance of current limiter 110, which can provide current limiter with a relatively sharper current limiting characteristic such as illustrated in FIG. 4.

Figure 5:
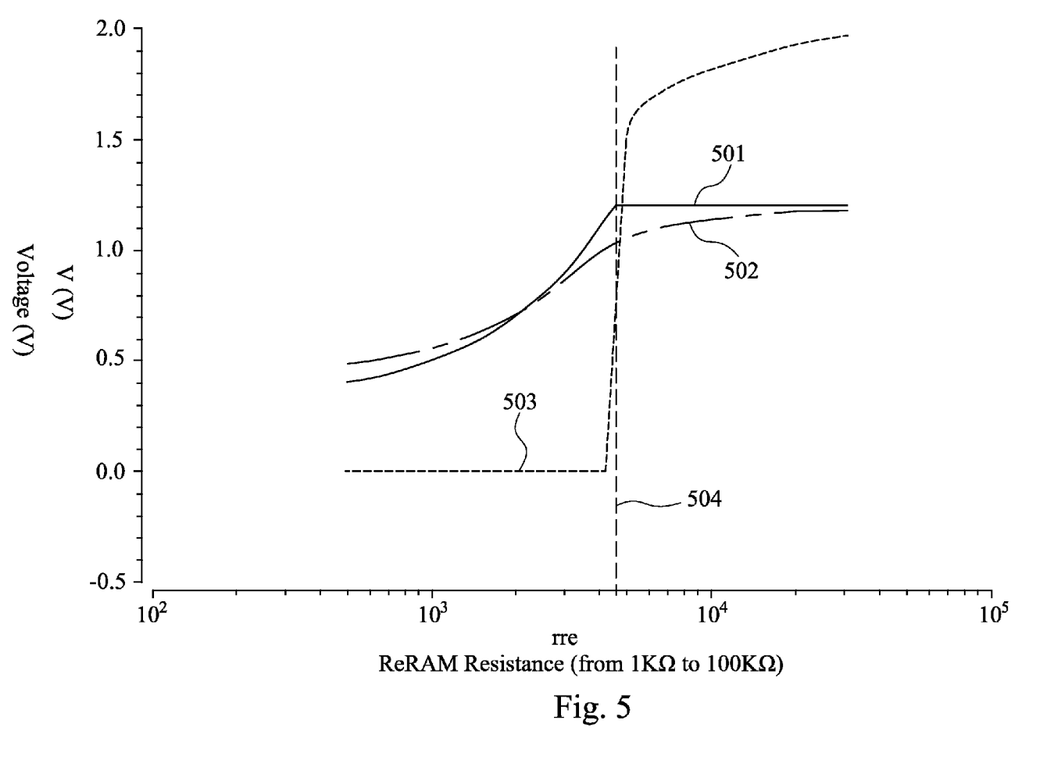
FIG. 5 illustrates an exemplary plot of voltage across an RRAM cell and of operational amplifier output in a memory cell including a current limiter, and a plot of voltage across an alternative memory cell, as a function of resistance across a programmable resistor, in accordance with some embodiments.

FIG. 5 illustrates an exemplary plot of voltage across an RRAM cell and of operational amplifier output in a memory cell including a current limiter in accordance with some embodiments, e.g., memory cell 100 illustrated in FIG. 1, and a plot of voltage across a alternative memory cell, e.g., memory cell 300 illustrated in FIG. 3, as a function of resistance across a programmable resistor. The plot illustrated in FIG. 5 was prepared by initially simulating a word line voltage $V_{WL}$ equal to zero, based upon which the resistance of RRAM cell 130 or 330 is relatively high, e.g., about 20 kOhm, and then simulating changes in the resistance of the RRAM cell 130 or 330 and changes in the output $V_g$ of operational amplifier 121 or 321 based on increases in $V_{WL}$ up to a value of 3.0V. It can be seen in FIG. 5 that voltage 501 across RRAM cell 130 (illustrated in FIG. 1) remains substantially constant for resistances from about 20 kOhm down to a target resistance 504 defined by $V_{REF}/I_{LIMIT}$, in one nonlimiting embodiment being approximately 4,500 Ohm, at which the function describing the voltage 501 across RRAM cell 130 includes an inflection point, below which the voltage across the RRAM cell 130 decreases relatively rapidly to a value of approximately 0.4 V at a resistance of approximately 400 Ohm, which can result in improved throttling of the write operation. For example, output 503 $V_g$ of operational amplifier 121 (illustrated in FIG. 1) can vary relatively rapidly from a relatively high value, e.g., about 1.7 V or greater based upon the RRAM cell having the relatively high resistance, to a relatively low value, e.g., about 0.0 V based upon the RRAM cell having the relatively low resistance. As such, it should be appreciated that the output $V_g$ of operational amplifier 121 can change relatively rapidly as programmable resistor 131 of RRAM cell 130 changes resistance, which can facilitate detection of successful write operation using a write throttling circuit such as described above with reference to FIG. 2, e.g., by detecting a change in $V_g$ using inverter 241 based upon which flip flop 242 can generate an LDO disable signal $LDO_{Disable}$. In comparison, it can be seen in FIG. 5 that voltage 502 across RRAM cell 330 (illustrated in FIG. 3) decreases relatively smoothly and gradually for resistances from about 20 kOhm to approximately 400 Ohm, without significant inflection at the target resistance of approximately 4,500 Ohm, defined by $V_{REF}/I_{LIMIT}$.

Additionally, the present memory cells suitably can include, or can be coupled to, circuitry that can generate current limit $I_{LIMIT}$ or that can generate a suitable value of voltage $V_{plim}$ for use in controlling the current through second PMOS transistor 111 illustrated in FIG. 1 or second PMOS transistor 211 illustrated in FIG. 2. For example, FIG. 6 illustrates an exemplary memory cell array 600 including a reference cell, in accordance with some embodiments.

Memory cell array 600 can include a plurality of memory cells. In some embodiments, each memory cell can include current limiter 610, first LDO 620, and RRAM cell 630. Additionally, each of the memory cells can be coupled to a shared reference cell in a manner such as described in greater detail below. Alternatively, each of the memory cells can be coupled to, or can include, a corresponding reference cell in a manner analogous to that described below. As yet another alternative, a single memory cell can be coupled to, or can include, a single reference cell in a manner analogous to that described below. That is, the combination of a memory cell and a reference cell need not necessarily be part of an array of memory cells.

Figure 6:
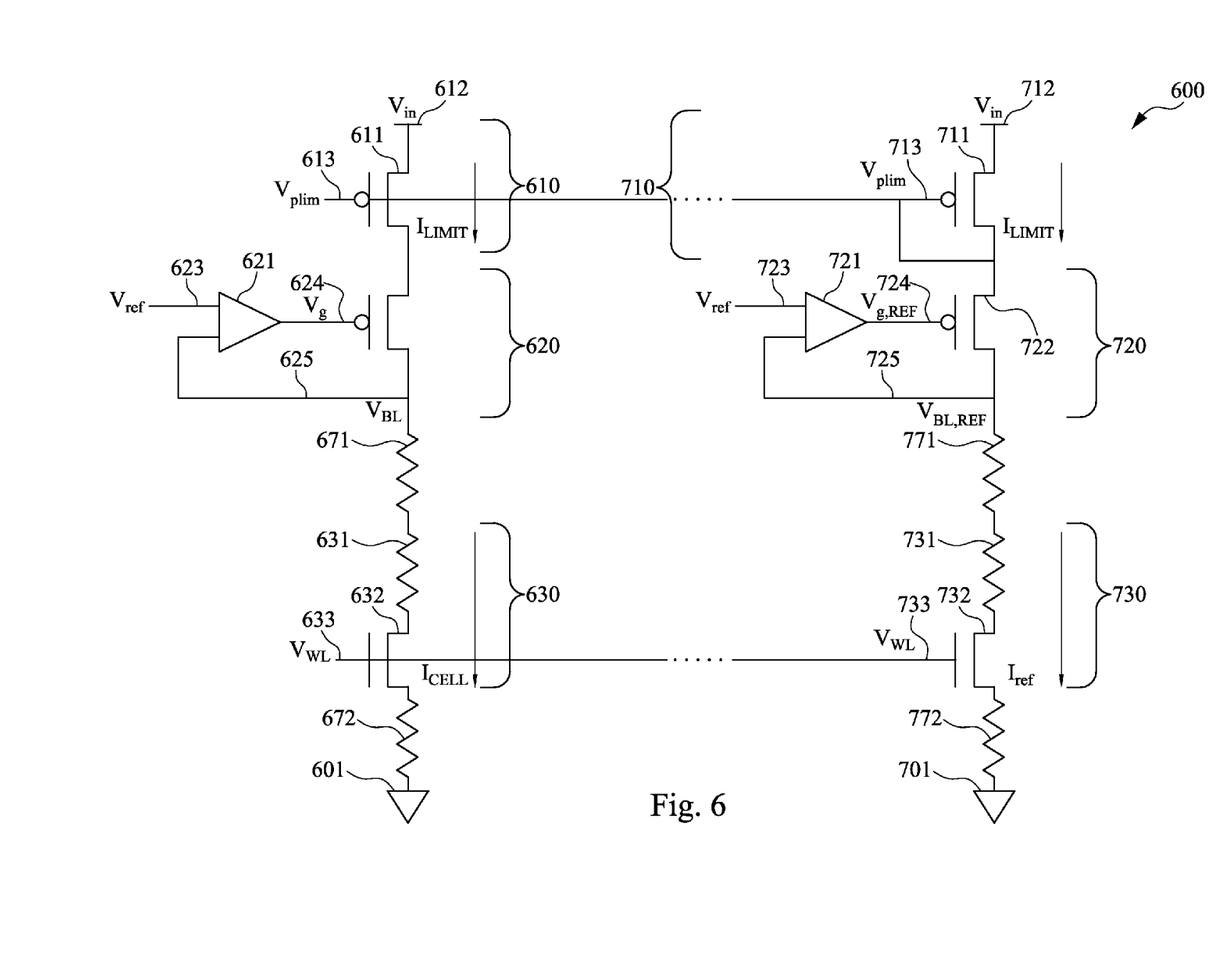
FIG. 6 illustrates an exemplary memory cell array including a reference cell, in accordance with some embodiments.

In the embodiment illustrated in FIG. 6, the first LDO 610 of each memory cell can include first operational amplifier 621 and first PMOS transistor 622 arranged in a closed loop. A first input 623 of first operational amplifier 621 can receive a reference voltage $V_{REF}$, e.g., from I/O circuitry (not specifically illustrated). An output 624 of first operational amplifier 621 can be coupled to a gate of first PMOS transistor 622, and a drain of first PMOS transistor 622 can be coupled to a second input 625 of first operational amplifier 621 to form the closed loop. Additionally, in the illustrated embodiment, the source of first PMOS transistor 622 is coupled to current limiter 610, and the drain of first PMOS transistor 622 is coupled to RRAM cell 630. First operational amplifier 621 outputs gate voltage $V_g$ to the gate of the first PMOS transistor 622 based upon a value of reference voltage $V_{REF}$, causing first LDO to output bit line voltage $V_{BL}$, e.g., to RRAM cell 630 of the corresponding memory cell of the array.

As illustrated in FIG. 6, RRAM cell 630 of each memory cell is coupled to first LDO 620 of that memory cell, e.g., below a junction between the drain of first PMOS transistor 622 and second input 625 of operational amplifier 621. RRAM cell 630 includes first select transistor 632 and programmable resistor 631. A gate of first select transistor 632 is coupled to word line 633 and receives a word line voltage $V_{WL}$ from the I/O circuitry. A drain of select transistor 632 is coupled, directly or indirectly, to ground 601. RRAM cell 630 receives as input the bit line voltage $V_{BL}$ from first LDO 620. Programmable resistor 631 is configured to change between a relatively high resistance and a relatively low resistance responsive to changes in cell current $I_{CELL}$ through RRAM cell 630 based upon values of $V_{BL}$ and $V_{WL}$ in a manner analogous to that described in greater detail elsewhere herein. Additionally, in the nonlimiting embodiment illustrated in FIG. 6, bit line resistor 671 having resistance $R_{BL}$ is coupled between RRAM cell 630 and first LDO 620, and select line resistor 672 having resistance $R_{SL}$ is coupled between first select transistor 632 and ground 601. However, resistors 671 and 672 need not necessarily be explicit devices in the circuit. Instead, resistors 671 and 672 can represent the parasitic resistance of metal wires in the bitline (671) and source line (672). Resistors 671 and 672 are illustrated in FIG. 6 because they can affect the program cell current through 631. Additionally, the reference path (dummy cell) 730 can include analogous resistances so as to provide better tracking between the reference branch 730 and the actual branch 630. For example, in the reference branch (dummy cell) 730, element 731 is similar to 671, which can represent parasitic bit line resistance. Similarly, element 701 can be similar to element 601 and represents parasitic source line resistance. In one nonlimiting example, resistor 771 can be designed so as to have the same resistance as the low-resistance state of 631.

Note that in the embodiment illustrated in FIG. 6, programmable resistor 631 is coupled between first PMOS transistor 622 and select transistor 632, optionally with bit line resistor 671 coupled between programmable resistor 631 and first PMOS transistor 622. Alternatively, RRAM cell 630 can have a "reverse" configuration (not specifically illustrated) in which select transistor 632 is coupled between programmable resistor 631 and first PMOS transistor 622, optionally with bit line resistor 671 coupled between select transistor 632 and first PMOS transistor 622. In such alternative embodiment, note that the drain of select transistor 632 is connected to ground through programmable resistor 631 and optional select line resistor 672.

Still referring to FIG. 6, current limiter 610 includes second PMOS transistor 611. A source of second PMOS transistor 611 is coupled to input 612 to which the I/O circuitry applies an input voltage $V_{IN}$. A gate of second PMOS transistor 611 is coupled to input 613 to which the I/O circuitry applies a limit voltage $V_{plim}$. A drain of second PMOS transistor 611 is coupled to first LDO 620, e.g., is coupled to the source of first PMOS transistor 622. Current limiter 610 can be configured analogously to current limiters 110 and 210 respectively described above with reference to FIGS. 1 and 2.

In the embodiment illustrated in FIG. 6, memory cell array 600 further includes a shared reference cell coupled to the gate of second PMOS transistor 611 of each of the memory cells. The reference cell includes mirror current limiter 710, second LDO 720, and dummy cell 730. Second LDO 720 includes second operational amplifier 721 and third PMOS transistor 722 arranged in a closed loop in a manner analogous to that of first operational amplifier 621 and first PMOS transistor 622, e.g., with first input 723 of second operational amplifier 721 receiving reference voltage $V_{REF}$ from the I/O circuitry, an output 724 of second operational amplifier 721 being coupled to a gate of third PMOS transistor 722, and a drain of third PMOS transistor 722 being coupled to second input 725 of second operational amplifier 721 so as to form a closed loop. Second operational amplifier 721 outputs reference gate voltage $V_{g,REF}$ to the gate of third PMOS transistor 722 based upon a value of reference voltage $V_{REF}$. Second LDO outputs reference bit line voltage $V_{BL,REF}$, e.g., to dummy cell 730.

Dummy cell 730 is coupled to second LDO 720. As illustrated in FIG. 6, dummy cell 730 include second select transistor 732 and resistor 731 having a similar parasitic resistance as 671. A gate of second select transistor 732 is coupled to word line 633 and receives the word line voltage $V_{WL}$ from the I/O circuitry. Dummy cell 730 receives as input the reference bit line voltage $V_{BL,REF}$ from second LDO 720 and resistor 771. A reference current $I_{REF}$ through dummy cell 730 can be based upon the fixed resistance of resistor 771 and on the values of $V_{BL,REF}$ and $V_{pu}$. In some embodiments, the resistance of resistor 771 is selected so as to be approximately equal to the relatively low resistance of programmable resistor 631, based upon which the cell current $I_{CELL}$ through RRAM cell 630 can become approximately equal to reference current $I_{REF}$ when programmable resistor 631 changes to the relatively low resistance state and the value of $V_{BL,REF}$ is equal to $V_{BL}$. Additionally, in the nonlimiting embodiment illustrated in FIG. 6, reference bit line resistor 771 having resistance $R_{BL,REF}$ is coupled between dummy cell 730 and second LDO 720, and reference source line parasitic resistance 772 having resistance $R_{SL,REF}$ is coupled between second select transistor 732 and ground 701.

Still referring to FIG. 6, mirror current limiter 710 of the reference cell can include fourth PMOS transistor 711. A source of fourth PMOS transistor 711 can be coupled to the input voltage $V_{IN}$ applied by the I/O circuitry, a gate of fourth PMOS transistor 711 can be coupled to the gate of second PMOS transistor 611, and a drain of fourth PMOS transistor 711 can be coupled to second LDO 720, e.g., the drain of fourth PMOS transistor 711 can be coupled to the source of third PMOS transistor 722. As such, the value of $V_{plim}$ applied to each memory cell, e.g., to the gate of the corresponding second PMOS transistor 611 of each cell, can be based upon the resistance values of 771, 731, and 732, in addition to the voltages shared between the two branches ($V_{WL}$, $V_{BL,REF}=V_{BL}=V_{REF}$, and $V_{plim}$). By matching the parasitic resistances of 671 to 771, and 601 to 701, the current $I_{LIMIT}$ flowing through 611 can be the same as current flowing through 711 only when the resistance of 631 is equal to the resistance of 771. This can be a way to set the value of $I_{LIMIT}$ of 611 that reflects the target resistance value of 631.

Additionally, note that each memory cell of array 600 optionally can include, or can be coupled to, a write throttle circuit such as circuit 240 described in greater detail above with reference to FIG. 3.

Additionally, note that in read operation, the LDO can be inactive. For RESET, the LDO can be active so as to provide a voltage to the source line (circuit not shown).

Figure 7:
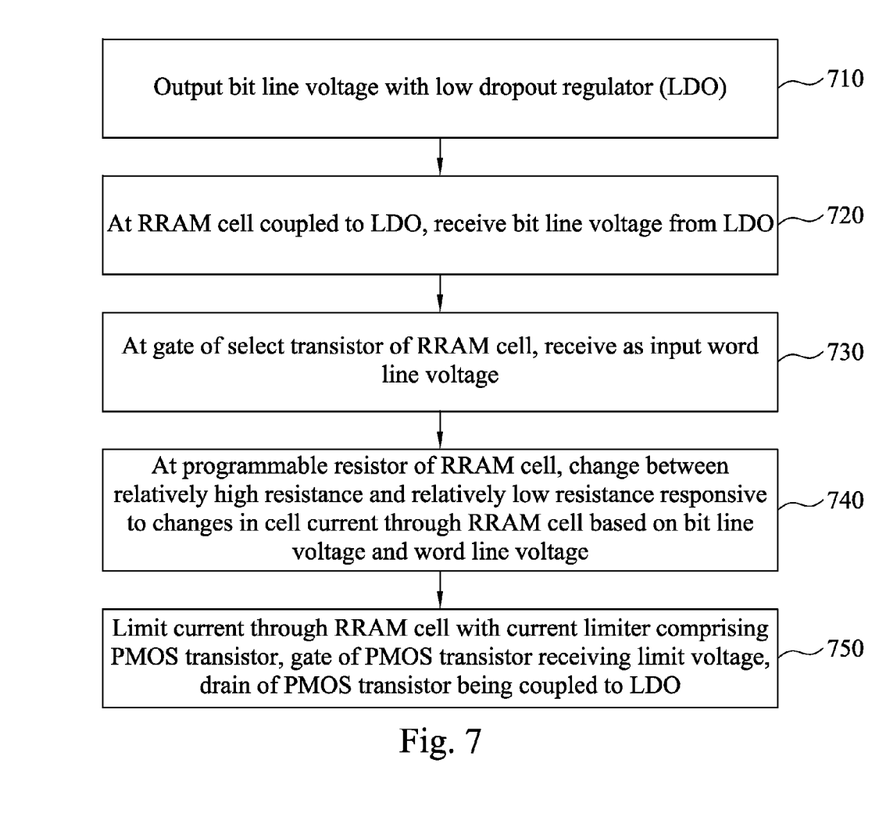
FIG. 7 illustrates an exemplary method for limiting current, according to some embodiments.

Methods are also provided herein. For example, FIG. 7 illustrates an exemplary method for limiting current, according to some embodiments. The method illustrated in FIG. 7 can include, for example, outputting a bit line voltage $V_{BL}$ with a low dropout regulator (LDO) (710). In nonlimiting embodiments, the LDO can be configured analogously as LDO 120 described above with reference to FIG. 1 or LDO 220 described above with reference to FIG. 2. The method illustrated in FIG. 7 also can include, for example, at a resistive random access memory (RRAM) cell coupled to the LDO, receiving as input the bit line voltage $V_{BL}$ from the LDO (720). In nonlimiting embodiments, the RRAM cell can be configured analogously as RRAM cell 130 described above with reference to FIG. 1 or RRAM cell 230 described above with reference to FIG. 2. The method illustrated in FIG. 7 also can include, for example, at a gate of a select transistor of the RRAM cell, receiving as input a word line voltage $V_{WL}$ (730). The method illustrated in FIG. 7 also can include, for example, at a programmable resistor of the RRAM cell, changing between a relatively high resistance and a relatively low resistance responsive to changes in a cell current $I_{CELL}$ through the RRAM cell based upon values of $V_{BL}$ and $V_{WL}$ (740). The method illustrated in FIG. 7 also can include, for example, limiting current through the RRAM cell with a current limiter comprising a PMOS transistor, a gate of the PMOS transistor receiving a limit voltage $V_{plim}$, a drain of the PMOS transistor being coupled to the LDO (750). In nonlimiting embodiments, the current limiter can be configured analogously as current limiter 110 described above with reference to FIG. 1 or current limiter 210 described above with reference to FIG. 2.

Based on the foregoing, it should be appreciated that the headroom of current limiter 110, 210, or 610 respectively illustrated in FIGS. 1, 2, and 6 can be hidden in the dropout range of the corresponding LDO 120, 220, or 620. For example, providing current limiter 110, 210, or 610 as part of, or connected to, the corresponding LDO 120, 220, or 620 can facilitate the current limiter operating under a voltage suitable for proper operation. In one illustrative, nonlimiting embodiment, LDO 120, 220, or 620 can have a dropout range of 500 mV defined by an exemplary input of 2.5 V and an exemplary output of 2.0 V. Current limiter 110, 210, or 610 can be hidden within such a dropout range, and accordingly can operate properly without creating significant additional voltage biases within the corresponding memory cell 100, 200 or memory cell array 600. The LDO supply voltage can be dictated by the I/O voltage in the SoC (system on chip). Based on experience, the commonly used 2.5 V I/O supply can provide sufficient dropout range for the headroom of the current limiter. It also should be appreciated that current limiters 110, 210, or 610 respectively illustrated in FIGS. 1, 2, and 6 need not necessarily impact the word line voltage $V_{WL}$. Additionally, the present memory cells can maintain a substantially constant voltage across the RRAM cell, e.g., across RRAM cell 130, 230, or 630 prior to the programmable resistor 131, 231, or 631 changing from the relatively high resistance to the relatively low resistance. Additionally, in embodiments that include a write throttling circuit such as described above with reference to FIG. 2, write detection can be based upon the output $V_g$ of an operational amplifier, e.g., amplifier 121, 221, or 621; because such output already has been amplified by the operational amplifier, additional circuitry need not necessarily be provided so as to further amplify the output, thus potentially saving area and power. Moreover, the present current limiters or write throttling circuits, or both, suitably can be applied to RRAM cells based on any present or future technology, including "reverse" RRAM cells. Indeed, because write operations in "reverse" RRAM cells can in some circumstances require a higher word line voltage $V_{WL}$, the present memory cells can reduce a bias across the RRAM cell that otherwise can be caused by such a word line voltage $V_{WL}$.

In one illustrative embodiment, a memory cell includes a first low dropout regulator (LDO) including a first operational amplifier and a first PMOS transistor arranged in a closed loop. A first input of the first operational amplifier receives a reference voltage $V_{REF}$. An output of the first operational amplifier is coupled to a gate of the first PMOS transistor. A drain of the first PMOS transistor is coupled to a second input of the first operational amplifier. The first operational amplifier outputs gate voltage $V_g$ to the gate of the first PMOS transistor based upon a value of reference voltage $V_{REF}$. The first LDO outputs bit line voltage $V_{BL}$. The memory cell also includes a resistive random access memory (RRAM) cell coupled to the first LDO. The RRAM cell includes a first select transistor and a programmable resistor. A gate of the first select transistor is coupled to a word line and receives a word line voltage $V_{WL}$. A drain of the first select transistor is coupled to a ground. The RRAM cell receives as input the bit line voltage $V_{BL}$ from the first LDO. The programmable resistor is configured to change between a relatively high resistance and a relatively low resistance responsive to changes in a cell current $I_{CELL}$ through the RRAM cell based upon values of $V_{BL}$ and $V_{WL}$. The memory cell also includes a current limiter that includes a second PMOS transistor. A source of the second PMOS transistor is coupled to an input voltage $V_{IN}$, a gate of the second PMOS transistor receives a limit voltage $V_{plim}$, and a drain of the second PMOS transistor is coupled to the first LDO.

In another illustrative embodiment, a memory cell array is provided. The array can include a first low dropout regulator (LDO) that includes a first operational amplifier and a first PMOS transistor arranged in a closed loop. A first input of the first operational amplifier receives a reference voltage $V_{REF}$. An output of the first operational amplifier is coupled to a gate of the first PMOS transistor. A drain of the first PMOS transistor is coupled to a second input of the first operational amplifier. The first operational amplifier outputs gate voltage $V_g$ to the gate of the first PMOS transistor based upon a value of reference voltage $V_{REF}$. The first LDO outputs bit line voltage $V_{BL}$. The array also can include a current limiter comprising a second PMOS transistor, a source of the second PMOS transistor being coupled to an input voltage $V_{IN}$. A gate of the second PMOS transistor receives a limit voltage $V_{plim}$, and a drain of the second PMOS transistor is coupled to the first LDO. The array also includes a plurality of memory cells. Each memory cell of the plurality of memory cells includes a resistive random access memory (RRAM) cell coupled to the first LDO. The RRAM cell includes a first select transistor and a programmable resistor. A gate of the first select transistor is coupled to a word line and receives a word line voltage $V_{WL}$. The RRAM cell receives as input the bit line voltage $V_{BL}$ from the first LDO. The programmable resistor is configured to change between a relatively high resistance and a relatively low resistance responsive to changes in a cell current $I_{CELL}$ through the RRAM cell based upon values of $V_{BL}$ and $V_{WL}$. The memory cell array further includes a reference cell coupled to the gate of the second PMOS transistor of each of the memory cells. The reference cell includes a second LDO that includes a second operational amplifier and a third PMOS transistor arranged in a closed loop. A first input of the second operational amplifier receives the reference voltage $V_{REF}$. An output of the second operational amplifier is coupled to a gate of the third PMOS transistor. A drain of the third PMOS transistor is coupled to a second input of the second operational amplifier, the second operational amplifier outputs reference gate voltage $V_{g,REF}$ to the gate of the third PMOS transistor based upon a value of reference voltage $V_{REF}$. The second LDO outputs reference bit line voltage $V_{BL,REF}$. The reference cell further includes a dummy cell coupled to the second LDO, the dummy cell including a second select transistor and a resistor having a fixed resistance. A gate of the second select transistor is coupled to the word line and receives the word line voltage $V_{WL}$. The reference cell receives as input the reference bit line voltage $V_{BL,REF}$ from the second LDO. A current $I_{REF}$ through the dummy cell is based upon the fixed resistance and on the values of $V_{BL,REF}$ and $V_{WL}$. The reference cell further includes a mirror current limiter that includes a fourth PMOS transistor. A source of the fourth PMOS transistor is coupled to the input voltage $V_{IN}$, a gate of the fourth PMOS transistor is coupled to the gate of the second PMOS transistor, and a drain of the fourth PMOS transistor is coupled to the second LDO. The value of $V_{plim}$ for each memory cell is based upon a difference between the resistance of the programmable resistor of that memory cell and the fixed resistance.

In still another illustrative embodiment, a memory cell can include a first low dropout regulator (LDO). The first LDO can include a first operational amplifier and a first PMOS transistor arranged in a closed loop. A first input of the first operational amplifier can receive a reference voltage $V_{REF}$, an output of the first operational amplifier can be coupled to a gate of the first PMOS transistor, and a drain of the first PMOS transistor can be coupled to a second input of the first operational amplifier. The first operational amplifier can output gate voltage $V_g$ to the gate of the first PMOS transistor based upon a value of reference voltage $V_{REF}$. The first LDO can output bit line voltage $V_{BL}$. The memory cell also can include a resistive random access memory (RRAM) cell coupled to the first LDO. The RRAM cell can include a first select transistor and a programmable resistor, a gate of the first select transistor being coupled to a word line and receiving a word line voltage $V_{WL}$, a drain of the first select transistor being coupled to a ground. The RRAM cell can be configured to receive as input the bit line voltage $V_{BL}$ from the first LDO. The programmable resistor can be configured to change between a relatively high resistance and a relatively low resistance responsive to changes in a cell current $I_{CELL}$ through the RRAM cell based upon values of $V_{BL}$ and $V_{WL}$. The memory cell also can include a current limiter comprising a second NMOS transistor. A source of the second NMOS transistor can be coupled to the drain of the first PMOS transistor, a gate of the second NMOS transistor can receive a limit voltage $V_{plim}$, and a drain of the second NMOS transistor can be coupled to a ground.

In yet another illustrative embodiment, a method includes outputting a bit line voltage $V_{BL}$ with a low dropout regulator (LDO). The method also can include, at a resistive random access memory (RRAM) cell coupled to the LDO, receiving as input the bit line voltage $V_{BL}$ from the LDO. The method also can include, at a gate of a select transistor of the RRAM cell, receiving as input a word line voltage $V_{WL}$. The method also can include, at a programmable resistor of the RRAM cell, changing between a relatively high resistance and a relatively low resistance responsive to changes in a cell current $I_{CELL}$ through the RRAM cell based upon values of $V_{BL}$ and $V_{WL}$. The method also can include limiting current through the RRAM cell with a current limiter comprising a PMOS transistor, a gate of the PMOS transistor receiving a limit voltage $V_{plim}$, a drain of the PMOS transistor being coupled to the LDO.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
 a first low dropout regulator (LDO) comprising a first operational amplifier and a first PMOS transistor arranged in a closed loop, a first input of the first operational amplifier receiving a reference voltage $V_{REF}$, an output of the first operational amplifier being coupled to a gate of the first PMOS transistor, and a drain of the first PMOS transistor being coupled to a second input of the first operational amplifier, the first operational amplifier outputting gate voltage $V_g$ to the gate of the first PMOS transistor based upon a value of reference voltage $V_{REF}$, the first LDO outputting bit line voltage $V_{BL}$;

a resistive random access memory (RRAM) cell coupled to the first LDO, the RRAM cell comprising a first select transistor and a programmable resistor, a gate of the first select transistor being coupled to a word line and receiving a word line voltage $V_{WL}$, a drain of the first select transistor being coupled to a ground, the RRAM cell receiving as input the bit line voltage $V_{BL}$ from the first LDO, the programmable resistor being configured to change between a relatively high resistance and a relatively low resistance responsive to changes in a cell current $I_{CELL}$ through the RRAM cell based upon values of $V_{BL}$ and $V_{WL}$; and a current limiter comprising a second PMOS transistor, a source of the second PMOS transistor being coupled to an input voltage $V_{IN}$, a gate of the second PMOS transistor receiving a limit voltage $V_{plim}$, a drain of the second PMOS transistor being coupled to the first LDO.

2. The memory cell of claim 1, the current limiter limiting a current provided to the source of the first PMOS transistor to a value $I_{LIMIT}$.

3. The memory cell of claim 1, wherein based upon $I_{CELL}$ being less than $I_{LIMIT}$ and the programmable resistor having the relatively high resistance, a voltage across the programmable resistor is substantially constant.

4. The memory cell of claim 3, wherein based upon $I_{CELL}$ approaching or equaling $I_{LIMIT}$ responsive to the programmable resistor changing from the relatively high resistance to the relatively low resistance, a voltage across the second PMOS transistor increases, and based upon the voltage across the second PMOS transistor increasing, $I_{CELL}$ decreases to a level that reduces or inhibits a further decrease in the resistance of the programmable resistor.

5. The memory cell of claim 1, wherein the programmable resistor is coupled between the first PMOS transistor and the first select transistor.

6. The memory cell of claim 1, wherein the first select transistor is coupled between the programmable resistor and the first PMOS transistor.

7. The memory cell of claim 1, wherein the first select transistor comprises an NMOS transistor.

8. The memory cell of claim 1, further comprising a write throttle circuit, the write throttle circuit comprising an inverter and a flip-flop, the inverter including an input coupled to the output of the first operational amplifier and an output coupled to a reset input R of the flip-flop, a set input S of the flip-flop receiving a write voltage Throttle$_{ENB}$, an output QB of the flip-flop being coupled to a third input of the operational amplifier, wherein the inverter is configured to output a transition signal to the reset input R of the flip flop based upon $V_g$ becoming lower than a threshold $V_{th,n}$ based upon the programmable resistor changing to the relatively low resistance, the flip-flop outputting an LDO disable signal LDO$_{Disable}$ to the first operational amplifier responsive to the transition signal from the inverter and based upon write voltage Throttle$_{ENB}$ being high, the output of the first operational amplifier disabling current flow through the gate of the first PMOS transistor responsive to the LDO$_{Disable}$ signal.

9. The memory cell of claim 8, wherein the inverter comprises a low-skewed inverter.

10. The memory cell of claim 8, further comprising a delay circuit coupled between the output of the flip-flop and the third input of the first operational amplifier, the delay circuit configured to delay transmission of LDO$_{Disable}$ to the third input of the first operational amplifier by a preselected amount of time.

11. The memory cell of claim 10, wherein the delay circuit comprises a plurality of inverters connected in series with one another.

12. The memory cell of claim 1, further comprising a reference cell coupled to the gate of the second PMOS transistor, the reference cell comprising:

a second LDO comprising a second operational amplifier and a third PMOS transistor arranged in a closed loop, a first input of the second operational amplifier receiving the reference voltage $V_{REF}$, an output of the second operational amplifier being coupled to a gate of the third PMOS transistor, and a drain of the third PMOS transistor being coupled to a second input of the second operational amplifier, the second operational amplifier outputting reference gate voltage $V_{g,REF}$ to the gate of the third PMOS transistor based upon a value of reference voltage $V_{REF}$, the second LDO outputting reference bit line voltage $V_{BL,REF}$;

a dummy cell coupled to the second LDO, the dummy cell comprising a second select transistor and a resistor having a fixed resistance, a gate of the second select transistor being coupled to the word line and receiving the word line voltage $V_{WL}$, a drain of the second select transistor being coupled to the ground, the dummy cell receiving as input the reference bit line voltage $V_{BL,REF}$ from the second LDO, a current $I_{REF}$ through the dummy cell being based upon the fixed resistance and on the values of $V_{BL,REF}$ and $V_{WL}$; and a mirror current limiter comprising a fourth PMOS transistor, a source of the fourth PMOS transistor being coupled to the input voltage $V_{IN}$, a gate of the fourth PMOS transistor being coupled to the gate of the second PMOS transistor, a drain of the fourth PMOS transistor being coupled to the second LDO and to the gate of the second and fourth PMOS transistors, wherein the value of $V_{plim}$ is based upon a difference between the resistance of the programmable resistor and the fixed resistance.

13. The memory cell of claim 12, further comprising a bit line resistor having resistance $R_{BL}$ coupled between the RRAM cell and the first LDO and a select line resistor having resistance $R_{SL}$ coupled between the first select transistor and the ground, the reference cell further comprising a reference bit line resistor having a reference resistance $R_{BL,REF}$ coupled between the dummy cell and the second LDO, and a reference select line resistor having resistance $R_{SL,REF}$ coupled between the second select transistor and the ground.

14. The memory cell of claim 12, further comprising a write throttle circuit, the write throttle circuit comprising an inverter and a flip-flop, the inverter including an input coupled to the output of the first operational amplifier and an output coupled to a reset input R of the flip-flop, a set input S of the flip-flop receiving a write voltage Throttle$_{ENB}$, an output QB of the flip-flop being coupled to a third input of the operational amplifier, wherein the inverter is configured to output a transition signal to the reset input R of the flip flop based upon $V_g$ becoming lower than a threshold $V_{th,n}$ based upon the programmable resistor changing to the relatively low resistance, the flip-flop outputting an LDO disable signal $LDO_{Disable}$ to the first operational amplifier responsive to the transition signal from the inverter and based upon write voltage $Throttle_{ENB}$ being high, the output of the first operational amplifier disabling current flow through the gate of the first PMOS transistor responsive to the $LDO_{Disable}$ signal.

15. A memory cell array, comprising:

a first low dropout regulator (LDO) comprising a first operational amplifier and a first PMOS transistor arranged in a closed loop, a first input of the first operational amplifier receiving a reference voltage $V_{REF}$, an output of the first operational amplifier being coupled to a gate of the first PMOS transistor, and a drain of the first PMOS transistor being coupled to a second input of the first operational amplifier, the first operational amplifier outputting gate voltage $V_g$ to the gate of the first PMOS transistor based upon a value of reference voltage $V_{REF}$, the first LDO outputting bit line voltage $V_{BL}$;

a current limiter comprising a second PMOS transistor, a source of the second PMOS transistor being coupled to an input voltage $V_{IN}$, a gate of the second PMOS transistor receiving a limit voltage $V_{plim}$, a drain of the second PMOS transistor being coupled to the first LDO;

a plurality of memory cells, each memory cell of the plurality of memory cells comprising:

a resistive random access memory (RRAM) cell coupled to the first LDO, the RRAM cell comprising a first select transistor and a programmable resistor, a gate of the first select transistor being coupled to a word line and receiving a word line voltage $V_{WL}$, the RRAM cell receiving as input the bit line voltage $V_{BL}$ from the first LDO, the programmable resistor being configured to change between a relatively high resistance and a relatively low resistance responsive to changes in a cell current $I_{CELL}$ through the RRAM cell based upon values of $V_{BL}$ and $V_{WL}$; and a reference cell coupled to the gate of the second PMOS transistor of each of the memory cells, the reference cell comprising:

a second LDO comprising a second operational amplifier and a third PMOS transistor arranged in a closed loop, a first input of the second operational amplifier receiving the reference voltage $V_{REF}$, an output of the second operational amplifier being coupled to a gate of the third PMOS transistor, and a drain of the third PMOS transistor being coupled to a second input of the second operational amplifier, the second operational amplifier outputting reference gate voltage $V_{g,REF}$ to the gate of the third PMOS transistor based upon a value of reference voltage $V_{REF}$, the second LDO outputting reference bit line voltage $V_{BL,REF}$;

a dummy cell coupled to the second LDO, the dummy cell comprising a second select transistor and a resistor having a fixed resistance, a gate of the second select transistor being coupled to the word line and receiving the word line voltage $V_{WL}$, the dummy cell receiving as input the reference bit line voltage $V_{BL,REF}$ from the second LDO, a current $I_{REF}$ through the dummy cell being based upon the fixed resistance and on the values of $V_{BL,REF}$ and $V_{WL}$; and a mirror current limiter comprising a fourth PMOS transistor, a source of the fourth PMOS transistor being coupled to the input voltage $V_{IN}$, a gate of the fourth PMOS transistor being coupled to the gate of the second PMOS transistor, a drain of the fourth PMOS transistor being coupled to the second LDO, wherein the value of $V_{plim}$ for each memory cell is based upon a difference between the resistance of the programmable resistor of that memory cell and the fixed resistance.

16. The memory cell array of claim 15, each memory cell further comprising a bit line resistor having resistance $R_{BL}$ coupled between the RRAM cell and the first LDO and a select line resistor having resistance $R_{SL}$ coupled between the first select transistor and the ground, the reference cell further comprising a reference bit line resistor having a reference resistance $R_{BL,REF}$ coupled between the dummy cell and the second LDO and a reference select line resistor having resistance $R_{SL,REF}$ coupled between the second select transistor and the ground.

17. The memory cell array of claim 15, further comprising a plurality of write throttle circuits, each write throttle circuit being coupled to a corresponding one of the memory cells, each write throttle circuit comprising an inverter and a flip-flop, the inverter including an input coupled to the output of the first operational amplifier of the corresponding memory cell and an output coupled to a reset input R of the flip-flop, a set input S of the flip-flop receiving a write voltage $Throttle_{ENB}$, an output QB of the flip-flop being coupled to a third input of the operational amplifier of the corresponding memory cell, wherein the inverter is configured to output a transition signal to the reset input R of the flip flop based upon $V_g$ becoming lower than a threshold $V_{th,n}$ based upon the programmable resistor of the corresponding memory cell changing to the relatively low resistance, the flip-flop outputting an LDO disable signal $LDO_{Disable}$ to the first operational amplifier of the corresponding memory cell responsive to the transition signal from the inverter and based upon write voltage $Throttle_{ENB}$ being high, the output of the first operational amplifier of the corresponding memory cell disabling current flow through the gate of the first PMOS transistor of that memory cell responsive to the $LDO_{Disable}$ signal.

18. The memory cell array of claim 15, the current limiter of each memory cell limiting a current provided the source of the first PMOS transistor of that memory cell to a value $I_{LIMIT}$, optionally wherein based upon $I_{CELL}$ of that memory cell being less than $I_{LIMIT}$ and the programmable resistor of that memory cell having the relatively high resistance, a voltage across the programmable resistor is substantially constant, and and further optionally wherein based upon $I_{CELL}$ of that memory cell approaching or equaling $I_{LIMIT}$ responsive to the programmable resistor of that memory cell changing from the relatively high resistance to the relatively low resistance, a voltage across the second PMOS transistor of that memory cell increases, and based upon the voltage across the second PMOS transistor of that memory cell increasing, $I_{CELL}$ decreases to a level that reduces or inhibits a further decrease in the resistance of the programmable resistor of that memory cell.

19. A method, comprising:
outputting a bit line voltage $V_{BL}$ with a low dropout regulator (LDO);
at a resistive random access memory (RRAM) cell coupled to the LDO, receiving as input the bit line voltage $V_{BL}$ from the LDO;
at a gate of a select transistor of the RRAM cell, receiving as input a word line voltage $V_{WL}$;
at a programmable resistor of the RRAM cell, changing between a relatively high resistance and a relatively low resistance responsive to changes in a cell current $I_{CELL}$ through the RRAM cell based upon values of $V_{BL}$ and $V_{WL}$; and
limiting current through the RRAM cell with a current limiter comprising a PMOS transistor, a gate of the PMOS transistor receiving a limit voltage $V_{piini}$, a drain of the PMOS transistor being coupled to the LDO.

20. The method of claim 19, wherein based upon $I_{CELL}$ being less than $I_{LIMIT}$ and the programmable resistor having the relatively high resistance, a voltage across the programmable resistor is substantially constant.

* * * * *